(12) United States Patent
Jung

(10) Patent No.: US 7,998,816 B2
(45) Date of Patent: Aug. 16, 2011

(54) METHOD FOR FABRICATING SEMICONDUCTOR DEVICE HAVING VERTICAL GATE

(75) Inventor: Young-Kyun Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 98 days.

(21) Appl. No.: 12/494,782

(22) Filed: Jun. 30, 2009

(65) Prior Publication Data

US 2010/0163946 A1    Jul. 1, 2010

(30) Foreign Application Priority Data

Dec. 31, 2008  (KR) .................. 10-2008-0138589

(51) Int. Cl.
  *H01L 21/336*  (2006.01)
(52) U.S. Cl. .................. 438/269; 257/328; 257/E21.41; 438/212
(58) Field of Classification Search .................. 257/263, 257/302, 329, 330, E29.262, E21.375, E21.41, 257/E21.418, E21.629, E21.643; 438/206, 438/212, 268, 269, 270
See application file for complete search history.

(56) References Cited

U.S. PATENT DOCUMENTS

| | | | | |
|---|---|---|---|---|
| 5,324,673 A | * | 6/1994 | Fitch et al. | 438/156 |
| 7,241,655 B2 | * | 7/2007 | Tang et al. | 438/212 |
| 2007/0190766 A1 | * | 8/2007 | Seo et al. | 438/585 |

FOREIGN PATENT DOCUMENTS

KR  1020070052653  5/2007
KR  1020070058906  6/2007

OTHER PUBLICATIONS

Notice of Allowance issued from Korean Intellectual Property Office on Feb. 23, 2011.

* cited by examiner

*Primary Examiner* — Thao X Le
*Assistant Examiner* — William F Kraig
(74) *Attorney, Agent, or Firm* — IP & T Group LLP

(57) ABSTRACT

A method for fabricating a semiconductor device includes forming buried bit lines separated from each other by a trench in a substrate, forming a plurality of first pillar holes that expose a top surface of the substrate, forming first active pillars buried in the first pillar holes, forming a gate conductive layer over entire surface of a resultant structure including the first active pillars, forming a gate electrode by etching the gate conducting layer to cover the first active pillars, forming a plurality of second pillar holes that expose the first active pillars by partially etching the gate electrode, and forming second active pillars buried in the second pillar holes and connected to the first active pillars.

10 Claims, 12 Drawing Sheets

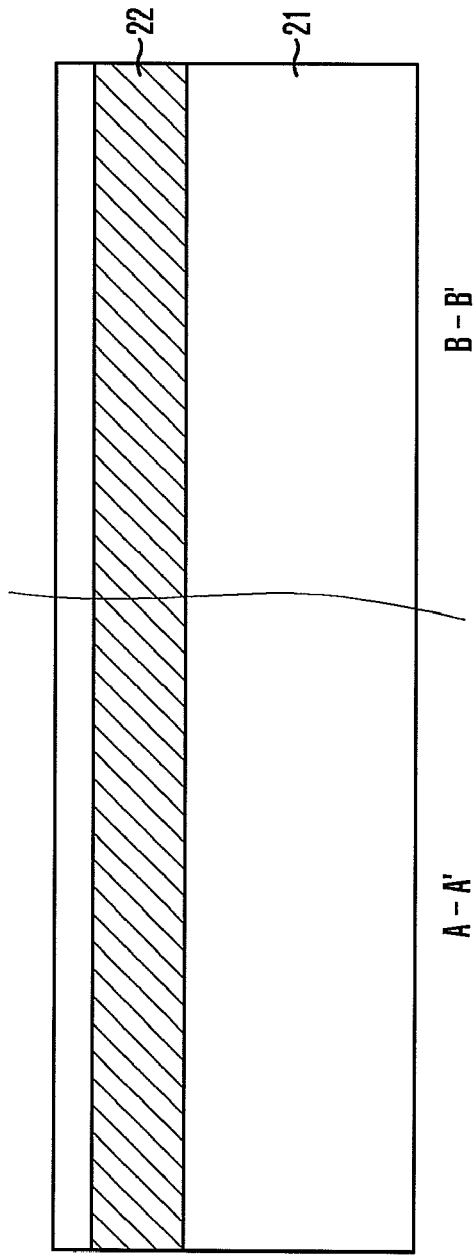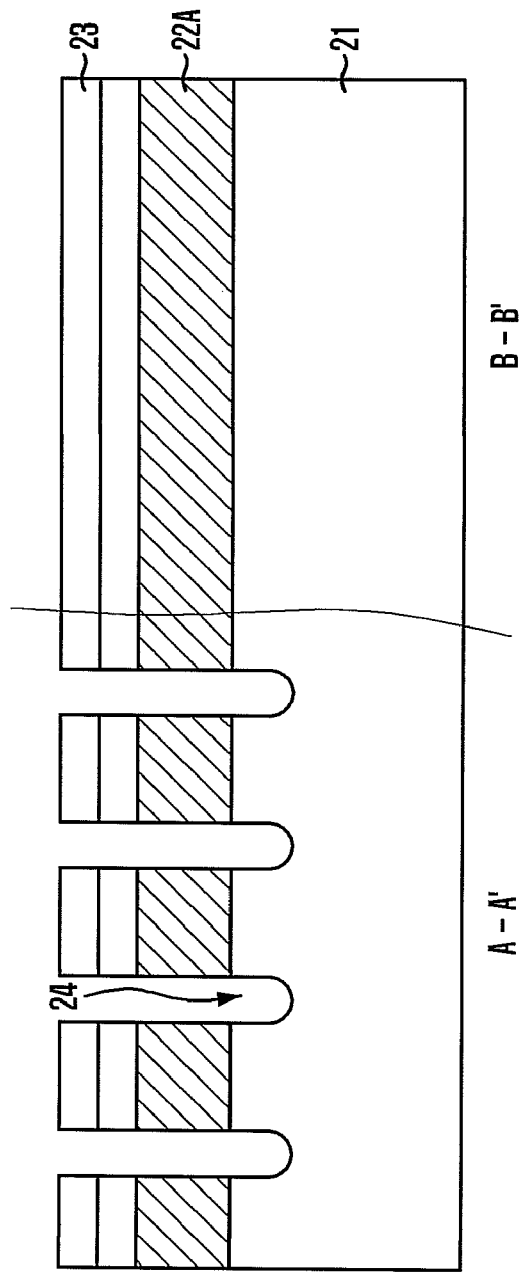
FIG. 4A
FIG. 4B

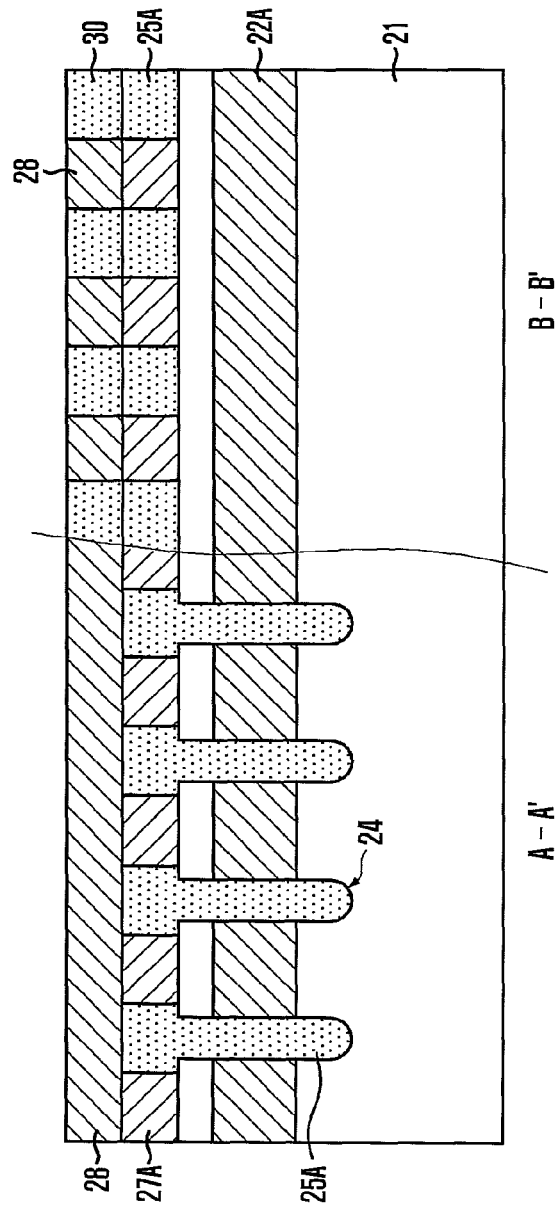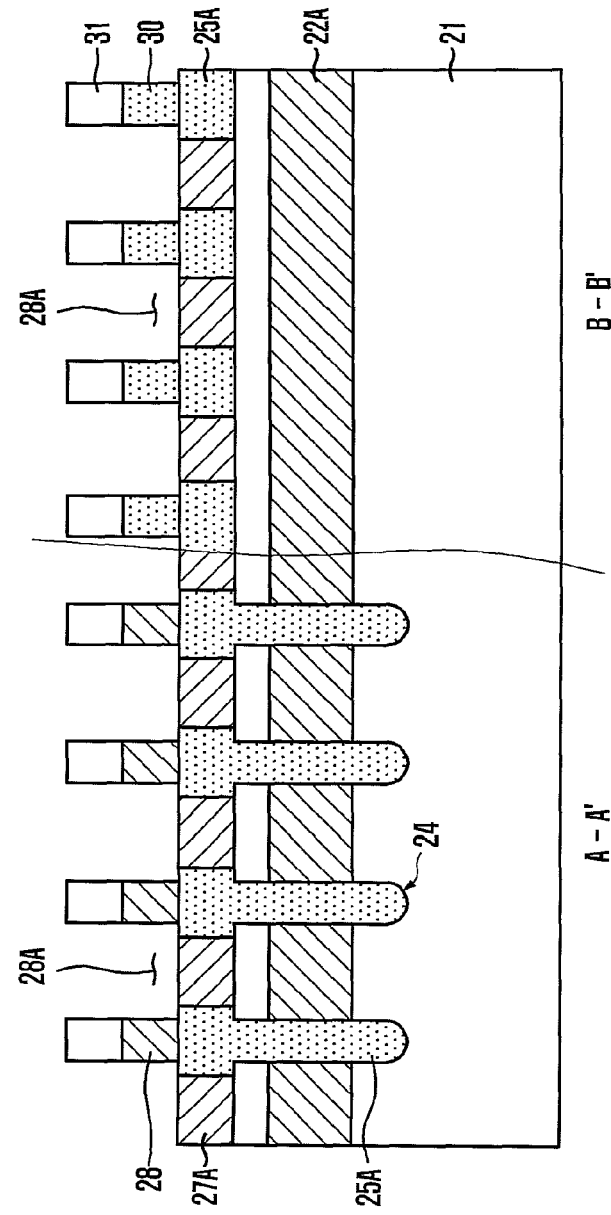

METHOD FOR FABRICATING SEMICONDUCTOR DEVICE HAVING VERTICAL GATE

CROSS-REFERENCE TO RELATED APPLICATIONS

The present application claims priority of Korean patent application number 10-2008-0138589, filed on Dec. 31, 2008, the disclosure of which is incorporated herein by reference in its entirety.

BACKGROUND OF THE INVENTION

The present invention relates to a method for fabricating a semiconductor device, and more particularly, to a method for fabricating a semiconductor device having a vertical gate and a method for fabricating the semiconductor device.

Recently, a memory device of sub-40 nm is required to enhance a degree of integration. However, it is rather difficult to achieve the memory device of sub-40 nm in case a transistor has a planar channel or a recess channel that is used in an $8F^2$ or $6F^2$ cell architecture, wherein F represents a minimum feature size. Therefore, there is required a dynamic random access memory (DRAM) device having a $4F^2$ cell architecture capable of enhancing the degree of integration 1.5 to 2 times in the same scaling. As a result, a semiconductor device having a vertical gate is proposed.

The semiconductor device having the vertical gate includes a pillar type active region, i.e., an active pillar, and a surround type vertical gate surrounding the active pillar by processing a semiconductor substrate, wherein a transistor includes the surround type vertical gate and a channel vertically formed on and below the active pillar around the vertical gate.

To fabricate the semiconductor device having the vertical gate, a buried bit line BBL is formed through the ion implantation and a trench process is performed to separate neighboring buried bit lines from each other.

FIG. 1 illustrates a cross-sectional view of a method for fabricating a semiconductor device having a conventional vertical gate.

Referring to FIG. 1, an active pillar 12 having a recessed sidewall is formed by etching a substrate 11 using a protection layer 13 as an etch barrier. A gate dielectric layer 17 is formed on the recessed sidewall of the active pillar 12 and then a vertical gate 14 surrounding the recessed sidewall of the active pillar 12 is formed on the gate dielectric layer 17.

Subsequently, after forming an impurity region in the substrate 11 through the ion implantation, the impurity region is divided by forming a trench 16 that reaches a depth where the impurity region is divided. Herein, the divided impurity regions become buried bit lines 15A and 15B.

However, the prior art has the following problems which will be described in relation to FIGS. 2A to 2C.

FIGS. 2A to 2C show the problems according to the prior art.

First of all, an isotropic etching process is performed to form a recessed sidewall of an active pillar. At this point, since a size of a lower portion of the active pillar is smaller than that of an upper portion thereof, pillar collapse may occur as can be seen from a reference numeral A of FIG. 2A.

Referring to FIG. 2B, an upper portion of an active pillar is damaged as performing an oxide etch-back process to form a buried bit line and prevent the leakage.

Referring to FIG. 2C, an upper portion of an active pillar is damaged when performing an etch-back process to form a vertical gate.

SUMMARY OF THE INVENTION

Embodiments of the present invention are directed to a semiconductor device including a vertical gate capable of preventing an upper portion of an active pillar from being damaged in a process such as a subsequent etch-back process, and a method for fabricating the semiconductor device.

Embodiments of the present invention are also to a semiconductor device including a vertical gate capable of preventing an active pillar from collapsing, and a method for fabricating the semiconductor device.

In accordance with an aspect of the present invention, there is provided a method for fabricating a semiconductor device including forming buried bit lines separated from each other by a trench in a substrate, forming a plurality of first pillar holes that expose a top surface of the substrate, forming first active pillars buried in the first pillar holes, forming a gate conductive layer over entire surface of a resultant structure including the first active pillars, forming a gate electrode by etching the gate conducting layer to cover the first active pillars, forming a plurality of second pillar holes that expose the first active pillars by partially etching the gate electrode, and forming second active pillars buried in the second pillar holes and connected to the first active pillars.

In accordance with another aspect of the present invention, there is provided a semiconductor device including a substrate where a buried bit line is formed, a first isolation layer formed on the substrate and providing a first pillar hole, a first active pillar buried in the first pillar hole, a gate electrode formed on the first isolation layer and providing a second pillar hole that exposes the first active pillar, a second active pillar buried into the second pillar hole and connected to the first active pillar, and a second isolation layer isolating neighboring gate electrodes.

BRIEF DESCRIPTION OF THE DRAWINGS

FIGS. 4A to 4I illustrate cross-sectional views of a method for fabricating a semiconductor device including a vertical gate in accordance with an embodiment of the present invention.

DESCRIPTION OF SPECIFIC EMBODIMENTS

Figure 1:
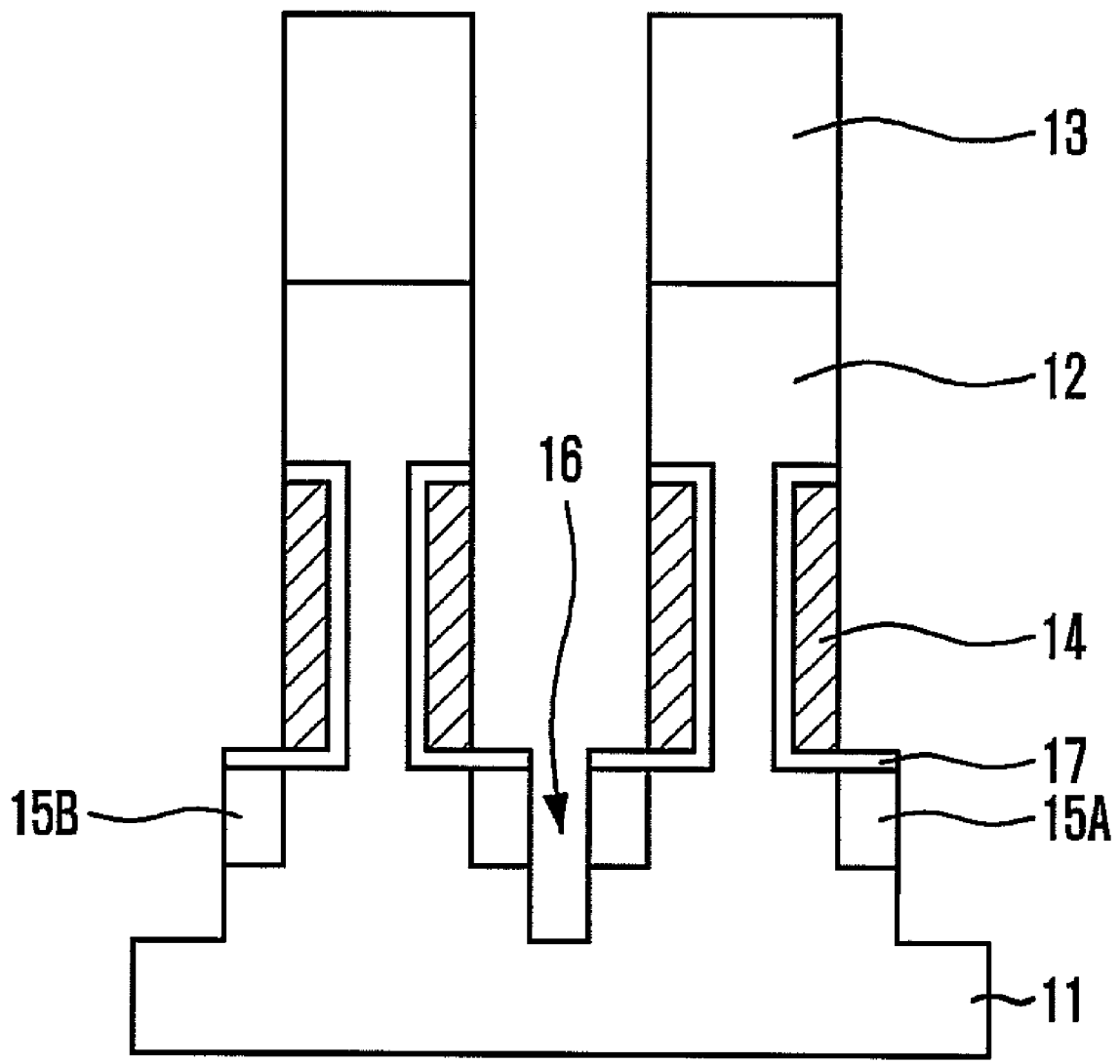
FIG. 1 illustrates a cross-sectional view of a method for fabricating a semiconductor device having a conventional vertical gate.
Figure 2A:
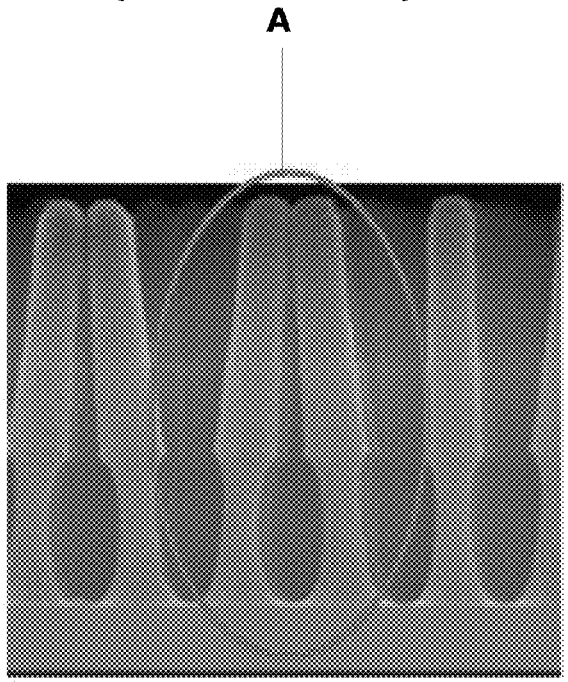
FIGS. 2A to 2C show problems in the prior art.
Figure 2B:
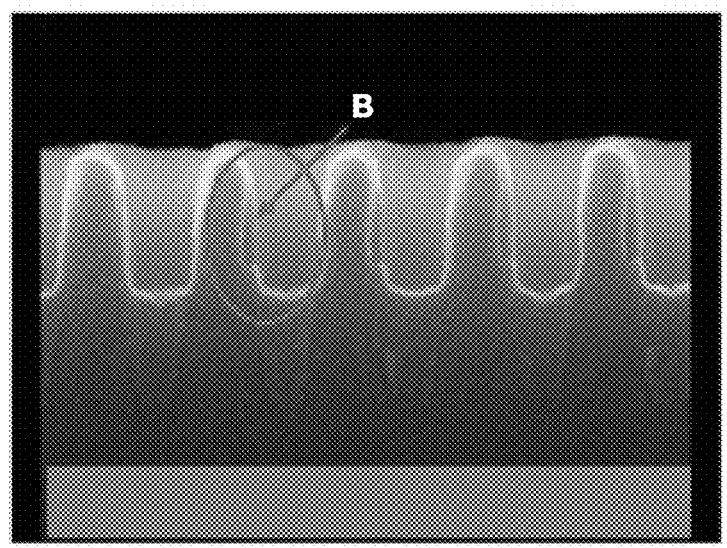
Figure 2C:
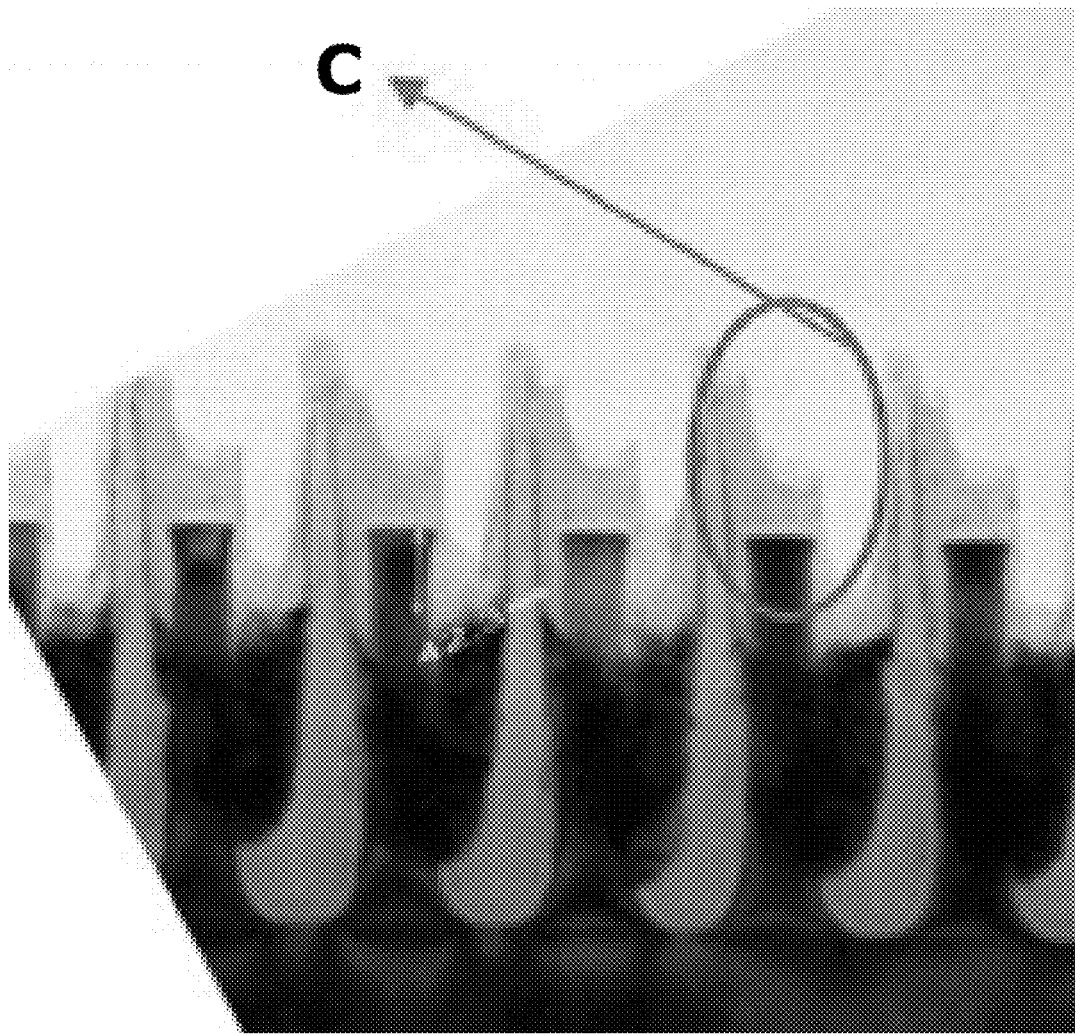

Other objects and advantages of the present invention can be understood by the following description, and become apparent with reference to the embodiments of the present invention. In the figures, the dimensions of layers and regions may be exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

Figure 3:
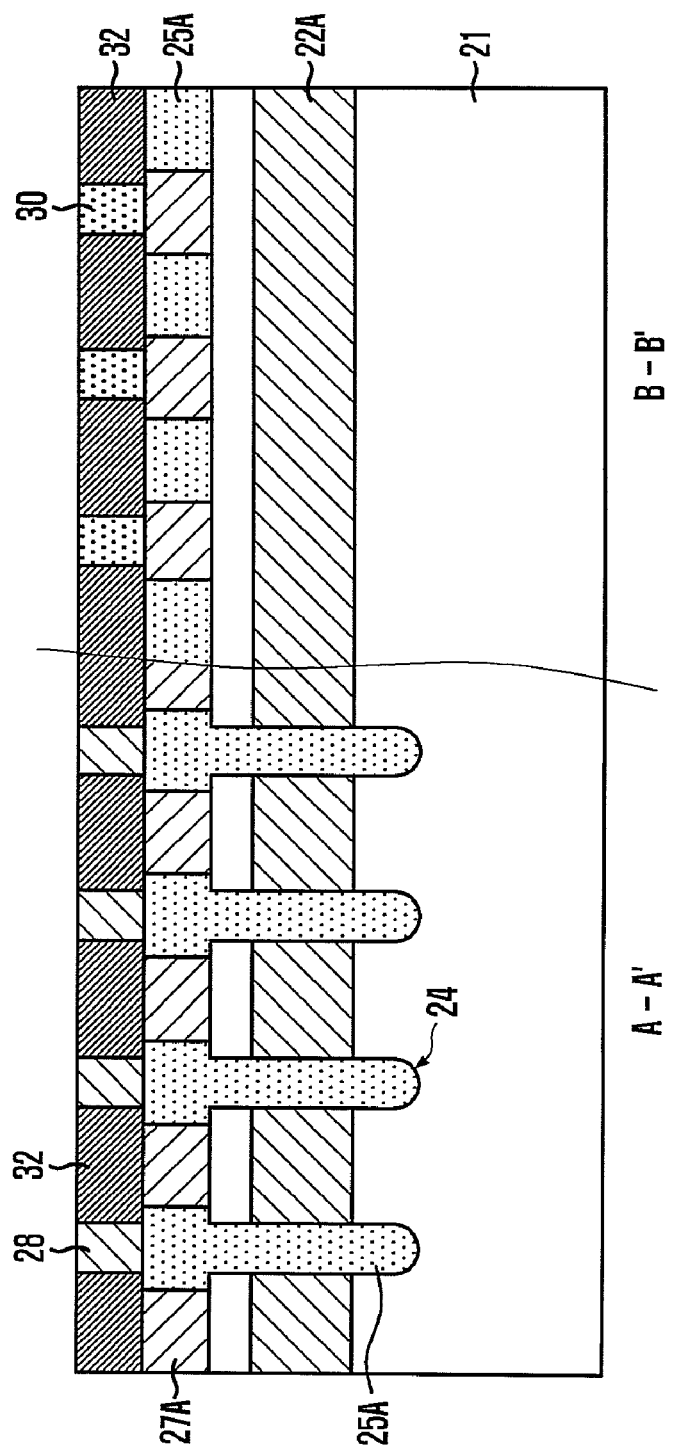
FIG. 3 illustrates a cross-sectional view of a semiconductor device in accordance with an embodiment of the present invention.

FIG. 3 illustrates a cross-sectional view of a semiconductor device in accordance with an embodiment of the present invention. Hereinafter, in each figure, an A-A' direction represents a direction crossing a buried bit line and a B-B' direction represents a direction parallel to the buried bit line. The A-A' direction and the B-B' direction are shown in FIGS. 4A to 4E.

Referring to FIG. 3, the semiconductor device includes a semiconductor substrate 21 where a buried bit line 22A is formed, a first isolation layer 25A formed on the semiconductor substrate 21 to provide a first pillar hole, a first active pillar 27A filling the first pillar hole, a gate electrode 28 formed on the first isolation layer 25A to provide a second pillar hole exposing the first active pillar 27A, a second active pillar 32 filling the second pillar hole and connected to the first active pillar 27A, and a second isolation layer 30 isolating gate electrodes 28. The first active pillar 27A and the second active pillar 32 include an epitaxial silicon layer. The gate electrode 28 includes a tungsten layer.

In FIG. 3, a line width of the second pillar hole is greater than that of the first pillar hole. Accordingly, a line width of the second active pillar becomes greater than that of the first active pillar. In the A-A' direction, the second active pillar 32 is surrounded by the gate electrode 28. In the B-B' direction, the second active pillar 32 has a line width where the second active pillar 32 is not surrounded by the gate electrode 28.

FIGS. 4A to 4I illustrate cross-sectional views of a method for fabricating a semiconductor device including a vertical gate in accordance with an embodiment of the present invention.

Referring to FIG. 4A, an impurity region 22 is formed by implanting impurity ions into a semiconductor substrate 21. The impurity region 22 is formed by implanting impurity ions such as phosphorus (P) and arsenic (As). The semiconductor substrate 21 may include a silicon layer. The impurity region 22 serves as a buried bit line.

Referring to FIG. 4B, a first photoresist pattern 23 is formed on the semiconductor substrate 21. The first photoresist pattern 23 is patterned in a line/space shape and serves as a BBL mask to isolate buried bit lines.

Then, a trench 24 is formed by etching the semiconductor substrate 21 up to a depth where the impurity region 22 is divided through an etching process using the first photoresist pattern 23.

In the foregoing manner, a buried bit line 22A is formed as the impurity region 22 is divided by the trench 24.

Figure 4C:
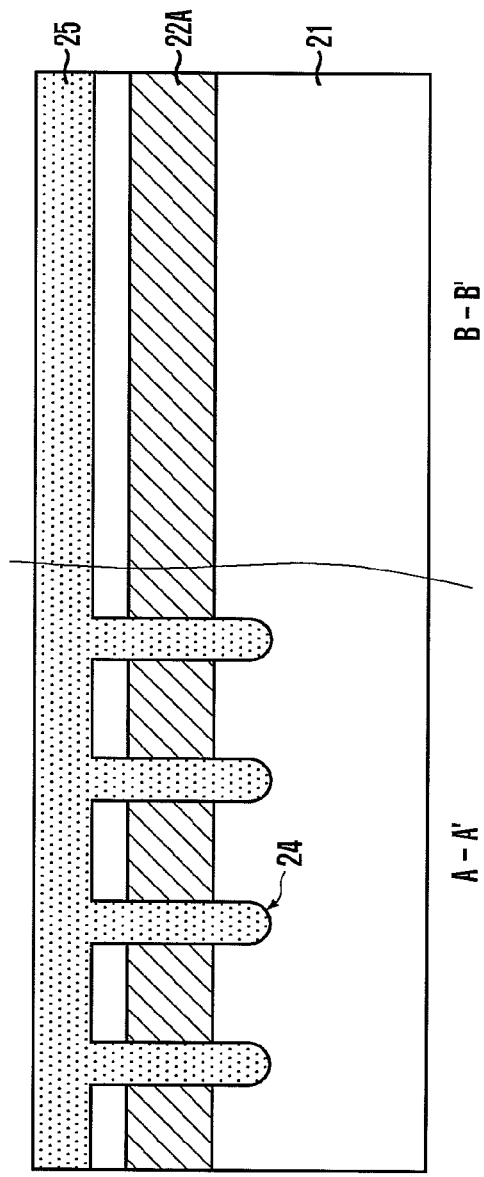

Referring to FIG. 4C, the first photoresist pattern 23 is removed. After then, a first inter-layer dielectric layer 25 gap-filling the trench 24 is formed. The first inter-layer dielectric (ILD) layer 25 may include an oxide layer such as a boro phosphorous silicate glass (BPSG) layer having an relatively superior gap-fill characteristic and serves as BBL ILD isolating neighboring buried bit lines 22A.

A surface of the first inter-layer dielectric layer 25 may be planarized. Herein, the planarization process may include a chemical mechanical polishing (CMP) process.

Figure 4D:
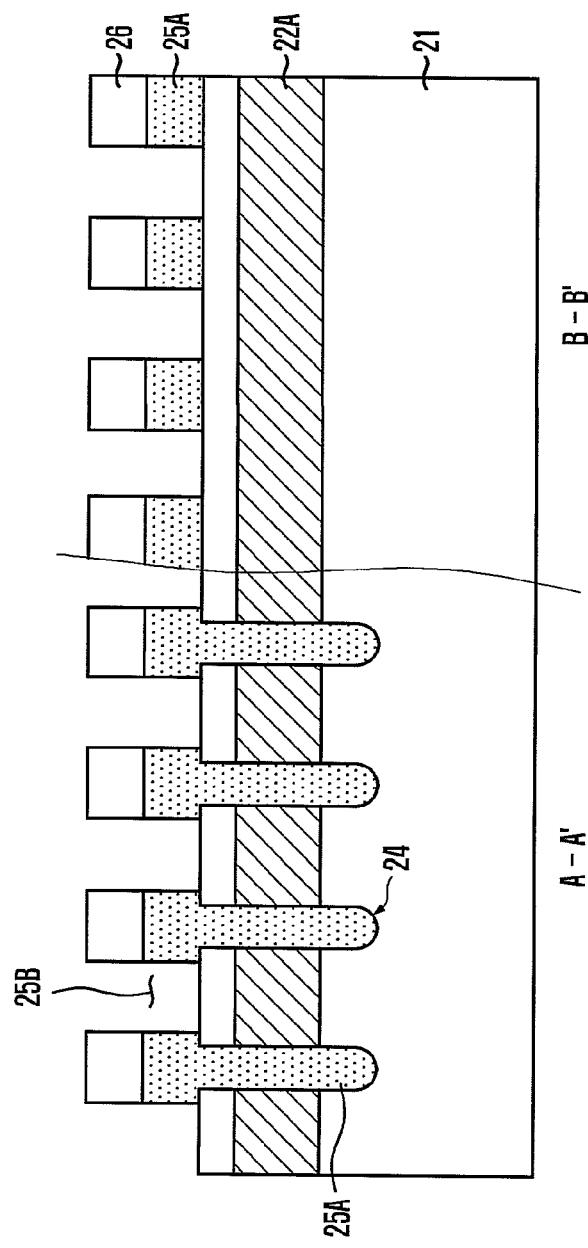

Referring to FIG. 4D, after forming a first pillar hole mask 26 where a first pillar hole is defined on the first inter-layer dielectric layer 25, the first inter-layer dielectric layer 25 is etched using the first pillar hole mask 26 as an etch barrier.

Hence, a first isolation layer 25A is formed. The first isolation layer 25A isolates neighboring buried bit lines 22A. When referring to the plane view, the first isolation layer 25A includes a first pillar hole 25B having a dot matrix shape.

Figure 5A:
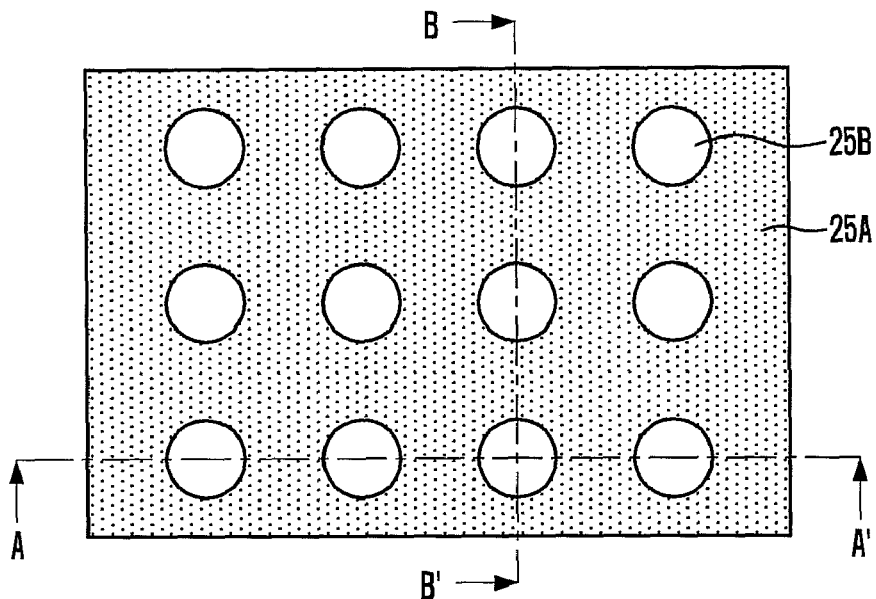
FIG. 5A illustrates a plane view of a structure including a first pillar hole.

FIG. 5A illustrates a plane view of a structure where the first pillar hole 25B is formed. In FIG. 5A, a plurality of first pillar holes 25B is arranged in the dot matrix shape in the first isolation layer 25A.

Figure 4E:
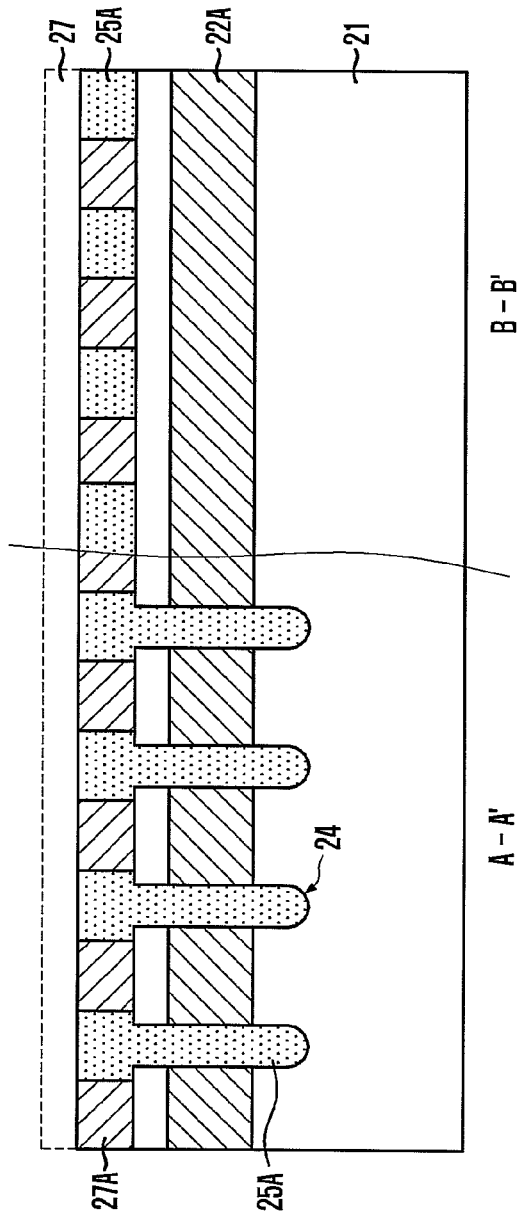

Referring to FIG. 4E, after removing the first pillar hole mask 26, a first silicon layer 27 is formed to have a certain thickness on the first isolation layer 25A and fill the first pillar holes in the first isolation layer 25A. Herein, since the first silicon layer 27 is planarized by a subsequent etch-back process, it is described with a dotted line for the simplicity of explanation.

The first silicon layer 27 is grown on a portion of the semiconductor substrate 21 that is exposed under the first pillar holes in the first isolation layer 25A by employing an epitaxial growth method. Therefore, the first silicon layer 27 may be a silicon epitaxial layer. The silicon epitaxial layer may be formed by employing a selective epitaxial growth (SEG) method using a silicon source such as $SiH_4$. When employing the SEG method, a process temperature is equal to or higher than 15° C. and the first silicon layer 27 may be doped with impurities having a certain concentration to serve as a channel.

The thickness of the first silicon layer 27 is adjusted based on a height of an active pillar through a subsequent etching process.

Then, a surface of the first isolation layer 25A is exposed by etching back the first silicon layer 27. Accordingly, a first active pillar 27A filling the first pillar hole 25B is formed. The first active pillar 27A is arranged in the dot matrix shape. After all, the first active pillar 27A is buried into the first pillar hole 25B formed in the first isolation layer 25A.

Figure 5B:
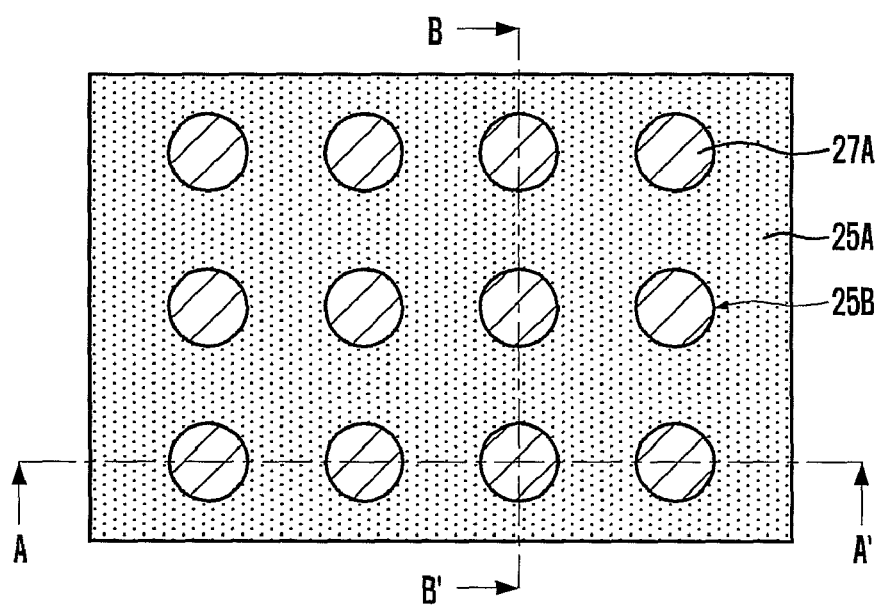
FIG. 5B illustrates a plane view of a structure including a first active pillar.

FIG. 5B illustrates a plane view of a structure where the first active pillar 27A is formed. The first active pillar 27A is buried into each first pillar hole 25B in the first isolation layer 25A. Since the shape of the first pillar hole 25B is transcribed to the first active pillar 27A, the first active pillar 27A is arranged in the dot matrix shape.

Figure 4F:
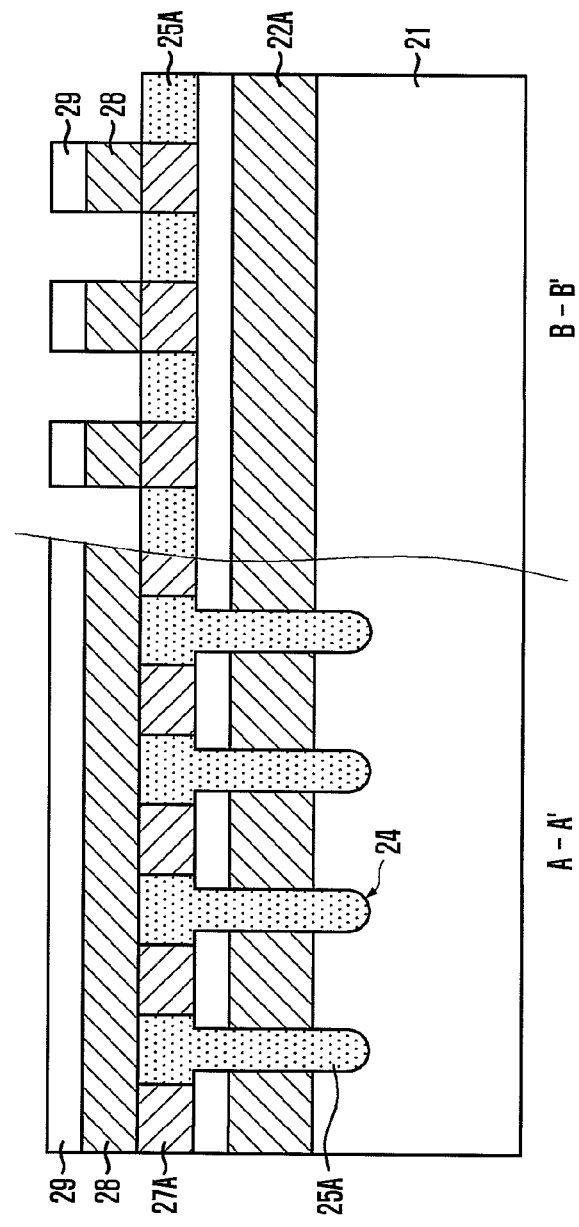

Referring to FIG. 4F, after forming a gate conducting layer on an entire surface of a resultant structure including the first active pillar 27A, the gate conducting layer is etched using a gate mask 29. Hence, a gate electrode 28 is formed. The gate electrode 28 includes a tungsten layer and a process of depositing the tungsten layer is performed at a temperature equal to or higher than approximately 100° C.

Referring to FIG. 4G, after removing the gate mask 29, a second inter-layer dielectric layer is deposited on an entire surface of a resultant structure to gap-fill spaces between the gate electrodes 28. Then, the second inter-layer dielectric layer is etched back to isolate the gate electrodes 28. Thus, a second isolation layer 30 is formed in the spaces between the gate electrodes 28. The second isolation layer 30 is formed of an oxide layer. The etch-back process is performed using oxygen plasma. When performing the etch-back process using the oxygen plasma, it is possible to prevent the damage of the gate electrode 28 disposed around the second isolation layer 30.

Figure 5C:
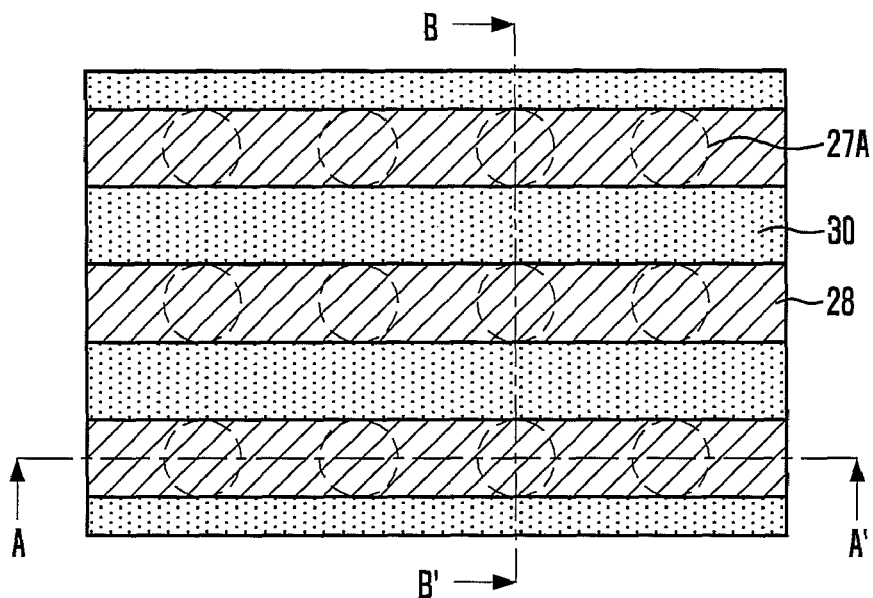
FIG. 5C illustrates a plane view of a structure including a gate electrode.

FIG. 5C illustrates a plane view of a structure where the gate electrode 28 is formed. The gate electrode 28 adjacent to the second isolation layer 30 is isolated by the second isolation layer 30. In the A-A' direction, the gate electrode 28 has a line shape. In the B-B' direction, gate electrodes 28 are arranged to have a constant interval. In both of the A-A' and the B-B' directions, the first active pillar 27A is disposed under the gate electrode 28.

Referring to FIG. 4H, a portion of the gate electrode 28 is etched using a second pillar hole mask 31. Accordingly, a second pillar hole 28A is formed and arranged in a dot matrix shape. A surface of the first active pillar 27A is exposed under the second pillar hole 28A. A line width of the second pillar hole 28A may be greater than that of the first pillar hole. That is, the line width of the second pillar hole 28A is greater than that of the first active pillar 27A.

Figure 5D:
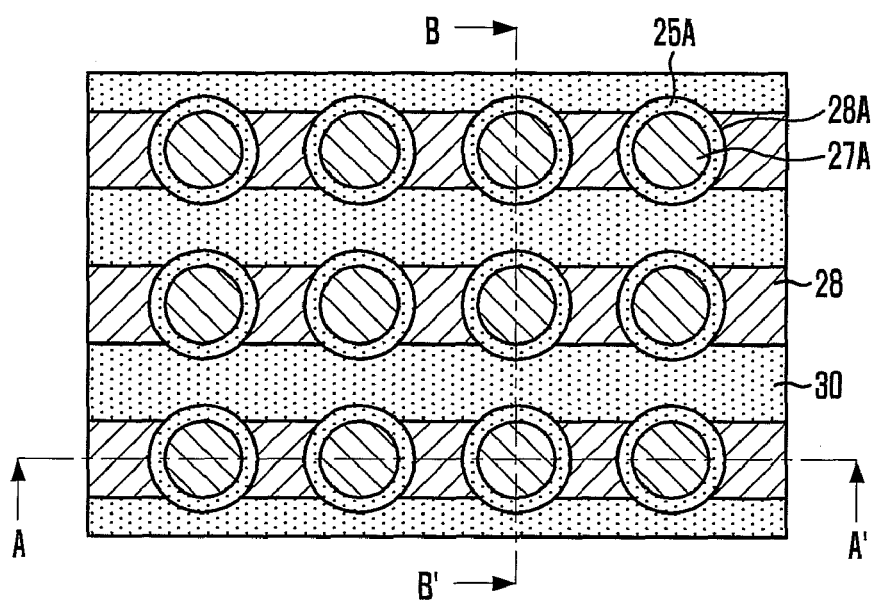
FIG. 5D illustrates a plane view of a structure including a second pillar hole.

FIG. 5D illustrates a plane view of a structure where the second pillar hole 28A is formed after removing the second pillar hole mask 31. The first active pillar 27A is exposed under the second pillar hole 28A. The line width of the second pillar hole 28A is greater than that of the first active pillar 27A.

Figure 4I:
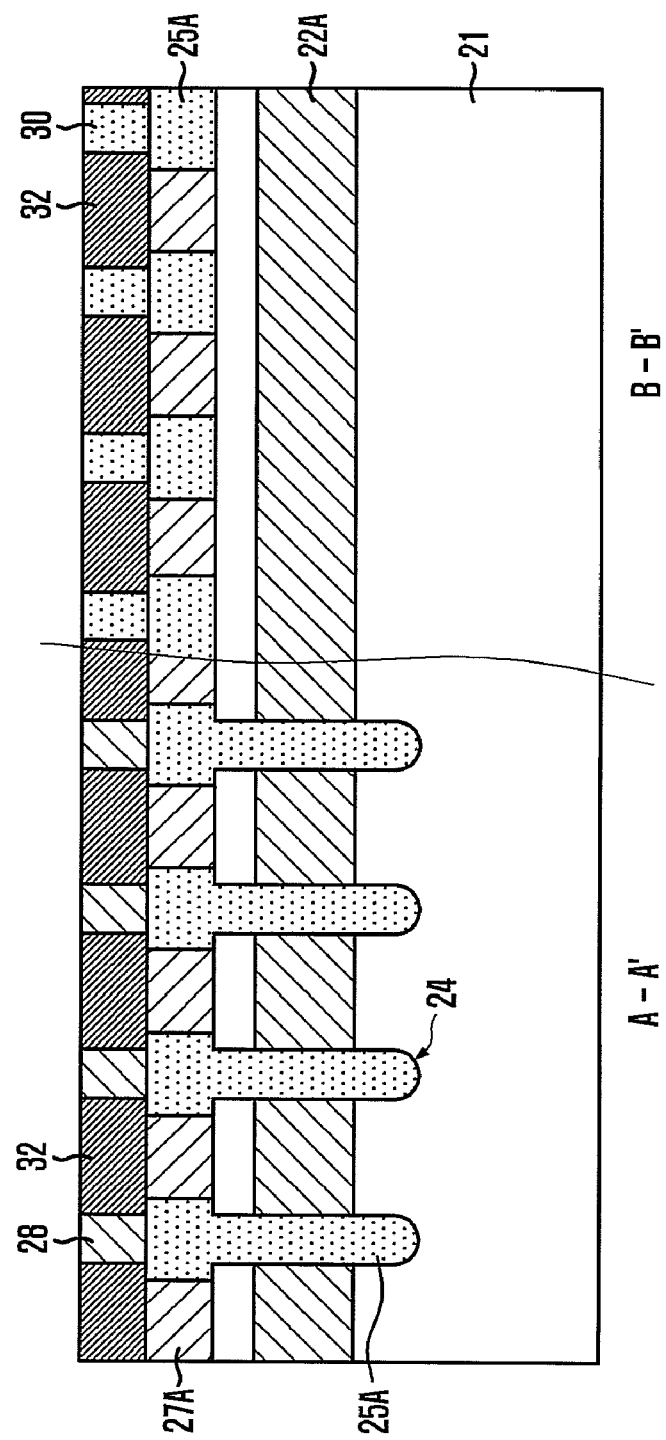

Referring to FIG. 4I, after growing a second silicon layer on the first active pillar 27A exposed under the second pillar hole, the second silicon layer is etched back so that the gate electrode 28 is exposed. Thus, a second active pillar 32 is formed. Since the gate electrode 28 is in a shape of surrounding a sidewall of the second active pillar 32, the gate electrode 28 becomes a vertical gate. Since the gate electrode 28 includes a single layer formed of tungsten, an interface characteristic of the second active pillar 32 and the gate electrode 28 is relatively superior.

The second silicon layer becoming the second active pillar 32 is grown on the first active pillar 27A exposed under the second pillar hole by employing the epitaxial growth method. Hence, the second silicon layer may be a silicon epitaxial layer. The silicon epitaxial layer may be formed by employing the SEG method using a silicon source such as $SiH_4$. When employing the SEG method, a process temperature is equal to or higher than 15° C. and the second silicon layer may be doped with impurities having a certain concentration to serve as a channel.

Figure 5E:
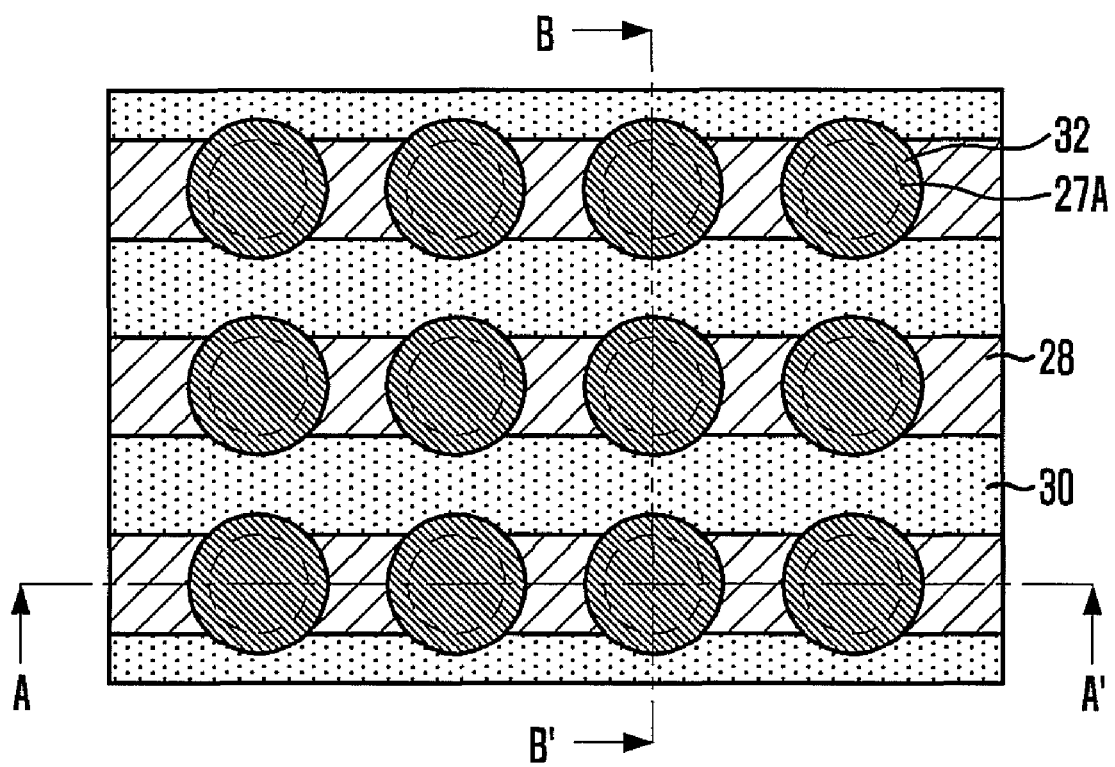
FIG. 5E illustrates a plane view of a structure including a second active pillar.

FIG. 5E illustrates a plane view of a structure where the second active pillar 32 is formed.

Referring to FIG. 5E, the second active pillar 32 is buried into the second pillar hole 28A and connected to the underlying first active pillar 27A. Therefore, the gate electrode 28 is in the shape of surrounding the sidewall of the second active pillar 32. That is, in the A-A' direction, the second active pillar 32 is surrounded by the gate electrode 28. In the B-B' direction, the second active pillar 32 has a line width which the second active pillar 32 is not surrounded by the gate electrode 28. The second isolation layer 30 isolates gate electrodes 28.

Although it is not shown, a gate dielectric layer may be formed before the second active pillar 32 is formed.

In accordance with the embodiments of the present invention, it is possible to prevent the active pillar from collapsing in the subsequent process by forming the active pillar in a shape of filling the pillar hole.

Further, the present invention can prevent the upper portion of the active pillar from being damaged in the trench process by performing the trench process for isolating neighboring buried bit lines prior to the process of forming the active pillar.

The present invention can also prevent the active pillar from being damaged by forming the active pillar buried into the pillar hole that is formed by etching the gate electrode.

Finally, in accordance with the present invention, it is possible to much more stably form the structure including the vertical gate used in a large scale semiconductor device of sub-30 nm and thus achieve a semiconductor device having relatively superior operational performance.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming buried bit lines separated from each other by a trench in a substrate;
   forming a plurality of first pillar holes that expose a top surface of the substrate;
   forming first active pillars buried in the first pillar holes;
   forming a gate conductive layer over entire surface of a resultant structure including the first active pillars;
   forming a gate electrode by etching the gate conducting layer to cover the first active pillars;
   forming a plurality of second pillar holes that expose the first active pillars by partially etching the gate electrode; and
   forming second active pillars buried in the second pillar holes and connected to the first active pillars.

2. The method of claim 1, wherein the second pillar holes have a line width greater than a line width of the first pillar holes.

3. The method of claim 1, wherein each of the first active pillars and the second active pillars is formed by forming a silicon layer over the first and second pillar holes through an epitaxial growth method and etching back the silicon layer.

4. The method of claim 1, wherein the first pillar holes and the second pillar holes are arranged in a dot matrix shape.

5. The method of claim 1, wherein forming the plurality of second pillar holes comprises:
   forming a photoresist pattern where the second pillar holes are defined to have a line width greater than a line width of the first pillar holes on the gate electrode; and
   etching the gate electrode using the photoresist pattern as an etch barrier.

6. The method of claim 1, wherein the gate electrode comprises a tungsten layer.

7. The method of claim 1, wherein the buried bit lines are formed by performing an impurity ion implantation process.

8. The method of claim 1, wherein forming a plurality of first pillar holes comprises:
   forming a first isolation layer over the substrate;
   forming a photoresist pattern where the first pillar holes are defined on the oxide layer; and
   etching the oxide layer using the photoresist pattern as an etch barrier.

9. The method of claim 1, after forming the gate electrode, further comprising forming a second isolation layer over an entire surface of a resultant structure including the gate electrode until spaces between neighboring gate electrodes are gap-filled and etching back the second isolation layer.

10. The method of claim 9, wherein the process of etching back the oxide layer is performed using oxygen plasma.

* * * * *